United States Patent
Chen et al.

(10) Patent No.: US 11,605,604 B2
(45) Date of Patent: Mar. 14, 2023

(54) FAN-OUT ANTENNA PACKAGING STRUCTURE AND PACKAGING METHOD

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 17/531,059

(22) Filed: Nov. 19, 2021

(65) Prior Publication Data

US 2022/0093539 A1   Mar. 24, 2022

Related U.S. Application Data

(62) Division of application No. 16/412,949, filed on May 15, 2019, now Pat. No. 11,211,343.

(30) Foreign Application Priority Data

Oct. 26, 2018 (CN) .......................... 201811259793.3
Oct. 26, 2018 (CN) .......................... 201821755416.4

(51) Int. Cl.
*H01L 23/66* (2006.01)
*H01L 23/498* (2006.01)
*H01L 23/31* (2006.01)
*H01Q 1/22* (2006.01)
*H01L 23/29* (2006.01)
*H01L 21/48* (2006.01)
*H01L 21/56* (2006.01)

(52) U.S. Cl.
CPC .......... *H01L 23/66* (2013.01); *H01L 21/4853* (2013.01); *H01L 21/4875* (2013.01); *H01L 21/568* (2013.01); *H01L 23/3128* (2013.01); *H01L 23/3135* (2013.01); *H01L 23/49816* (2013.01); *H01Q 1/2283* (2013.01); *H01L 23/293* (2013.01); *H01L 2223/6677* (2013.01)

(58) Field of Classification Search
CPC . H01L 2223/6677; H01Q 1/2283; H01Q 1/38
See application file for complete search history.

(56) References Cited

U.S. PATENT DOCUMENTS

| | | | |
|---|---|---|---|
| 2013/0009320 A1* | 1/2013 | Yoo | H01L 24/97 257/774 |
| 2018/0166405 A1* | 6/2018 | Chiang | H01L 24/73 |
| 2018/0342788 A1* | 11/2018 | Lasiter | H01L 21/02518 |
| 2019/0035749 A1* | 1/2019 | Dalmia | H01Q 1/2283 |

* cited by examiner

*Primary Examiner* — Raj R Gupta
(74) *Attorney, Agent, or Firm* — Alston & Bird LLP

(57) ABSTRACT

Disclosed is a fan-out antenna packaging method. A front surface of a semiconductor chip is jointed to a top surface of a separating layer; side surfaces and a bottom surface of the semiconductor chip are merged into a packaging layer; the packaging layer is separated from the separating layer to expose the front surface of the semiconductor chip; a rewiring layer is electrically connected to the semiconductor chip; a first antenna structure and a second antenna are stacked on a top surface of the rewiring layer, the antenna structures is electrically connected to the rewiring layer; a through hole runs through the packaging layer and exposes a metal wiring layer in the rewiring layer; and a metal bump electrically connected to the metal wiring layer is formed by using the through hole.

7 Claims, 6 Drawing Sheets

FAN-OUT ANTENNA PACKAGING STRUCTURE AND PACKAGING METHOD

CROSS REFERENCES TO RELATED APPLICATIONS

This application is the divisional application of U.S. patent application Ser. No. 16/412,949, filed May 15, 2019, entitled "Fan-Out Antenna Packaging Structure And Packaging Method". This application claims the benefits of priority of U.S. patent application Ser. No. 16/412,949, Chinese Patent Application No. CN2018112597933, entitled "Fan-Out Antenna Packaging Structure and Packaging Method", filed with CNIPA on Oct. 26, 2018, and Chinese Patent Application No. CN2018217554164, filed with CNIPA on Oct. 26, 2018, entitled "Fan-Out Antenna Packaging Structure", the contents of which are incorporated herein by reference in its entirety.

TECHNICAL FIELD

The present disclosure relates to the field of semiconductor packaging, and in particular, to a fan-out antenna packaging structure and packaging method.

BACKGROUND

Circuits that are cheaper, more reliable, faster and have a higher density are targets of integrated circuit packaging. In the future, the integrated circuit packaging will improve the integration density of various electronic devices by continuously reducing feature sizes. At present, conventional packaging methods include Wafer Level Chip Scale Packaging (WLCSP), Fan-Out Wafer Level Package (FOWLP), Flip Chip, Package on Package (POP), and the like. With a large number of input/output (I/O) ports and good integration flexibly, the FOWLP has become one of frequently used packaging methods at present.

With the popular high-tech electronics and demands of mobility from people, most high-tech electronics are provided with a radio communications function.

Generally, in an existing antenna structure, an antenna is directly fabricated on the surface of a circuit board. In such a method, the antenna occupies an additional area of the circuit board, resulting in poor conformity and high costs. For various high-tech electronics, a circuit board with a large volume is required if an antenna is directly fabricated on the surface of the circuit board. As a result, the high-tech electronics also have large volumes. This goes against people's requirements for miniaturization and portability of the high-tech electronics. In view of this, it is necessary to design a novel fan-out antenna packaging structure and packaging method to resolve the foregoing problems of large volume, low conformity, and high production costs of the antenna packaging structure.

SUMMARY

The present disclosure provides a fan-out antenna packaging method, comprising the following steps: providing a supporting substrate, and forming a separating layer on the supporting substrate; providing a semiconductor chip, and jointing a front surface of the semiconductor chip to a top surface of the separating layer; disposing a packaging layer around side surfaces and a bottom surface of the semiconductor chip, wherein the packaging layer comprises a first surface in contact with the separating layer and a second surface opposite to the first surface; pulling out the packaging layer from the separating layer to expose the front surface of the semiconductor chip; forming a rewiring layer on the first surface of the packaging layer, wherein the rewiring layer is electrically connected to the semiconductor chip; forming a first antenna structure on a top surface of the rewiring layer, wherein the first antenna structure is electrically connected to the rewiring layer, wherein the first antenna structure comprises a first antenna metal connecting block, a first antenna metal connecting column, a first antenna packaging layer, and a first antenna metal layer, wherein the first antenna metal layer is aligned with the first antenna metal column which is aligned with the first antenna metal block; forming a second antenna structure on the first antenna structure, wherein the second antenna structure comprises a second antenna metal connecting block, a second antenna metal connecting column, a second antenna packaging layer, and a second antenna metal layer, wherein the second antenna block overlays the first antenna metal layer, wherein the second antenna metal layer is aligned with the second antenna metal column which is aligned with the second antenna metal block; running through the packaging layer to form a through hole, wherein the through hole exposes a metal wiring layer in the rewiring layer; and forming, by using the through hole, a metal bump electrically connected to the metal wiring layer.

Optionally, the top surface of the rewiring layer further comprises a third antenna structure on a top surface of the second antenna structure comprising a third antenna metal connecting block, a third antenna metal connecting column, a third antenna packaging layer, and a third antenna metal layer, wherein the third antenna block overlays the second antenna metal layer, wherein the third antenna metal layer is aligned with the third antenna metal column which is aligned with the third antenna metal block.

Optionally, the separating layer comprises an adhesive tape whose viscosity decreases upon heating or illumination.

Optionally, the formed fan-out antenna packaging structure has a warpage level ranging from 0.1 mm to 3.0 mm.

Optionally, a method for forming the through hole comprises one or a combination of laser drilling and dry etching.

Optionally, the first antenna packaging layer surrounds the first antenna metal connecting column and exposes a top surface of the first antenna metal connecting column, and the first antenna metal layer is located on a top surface of the first antenna packaging layer and is electrically connected to the first antenna metal connecting column.

Optionally, the first, second and third packaging layers each comprises an epoxy molding layer.

Optionally, the first, second and third antenna structures each has a thickness ranging from 50 μm to 1000 μm.

Optionally, the metal bump protrudes from the through hole.

The present disclosure further provides a fan-out antenna packaging structure, wherein the packaging structure comprises: a rewiring layer, comprising a first surface and a second surface opposite to the first surface; a first antenna structure, is located on the second surface of the rewiring layer and electrically connected to a metal wiring layer in the rewiring layer, wherein the first antenna structure comprises a first antenna metal connecting block, a first antenna metal connecting column, a first antenna packaging layer, and a first antenna metal layer, wherein the first antenna metal layer is aligned with the first antenna metal column which is aligned with the first antenna metal block; a second antenna structure disposed on the first antenna structure, wherein the second antenna structure comprises a second antenna metal connecting block, a second antenna metal connecting column, a second antenna packaging layer, and a second antenna metal layer, wherein the second antenna block overlays the first antenna metal layer, wherein the second antenna metal layer is aligned with the second antenna metal column which is aligned with the second antenna metal block; a semiconductor chip located on the first surface of the rewiring layer, wherein a front surface of the semiconductor chip is electrically connected to the rewiring layer; a packaging layer, surrounding side surfaces and a bottom surface of the semiconductor chip and comprising a through hole that exposes the metal wiring layer; and a metal bump, electrically connected to the metal wiring layer through the through hole.

Optionally, the second surface of the rewiring layer comprises a third antenna structure on a top surface of the second antenna structure comprising a third antenna metal connecting block, a third antenna metal connecting column, a third antenna packaging layer, and a third antenna metal layer, wherein the third antenna block overlays the second antenna metal layer, wherein the third antenna metal layer is aligned with the third antenna metal column which is aligned with the third antenna metal block.

Optionally, the first, second and third fan-out antenna packaging structures each has a warpage level ranging from 0.1 mm to 3.0 mm.

Optionally, the first, second and third antenna structures each has a thickness ranging from 50 μm to 1000 μm.

Optionally, the first antenna packaging layer surrounds the first antenna metal connecting column and exposes a top surface of the first antenna metal connecting column, and the first antenna metal layer is located on a top surface of the first antenna packaging layer and is electrically connected to the first metal connecting column.

Optionally, the first, second and third packaging layers each comprise an epoxy molding layer.

Optionally, the metal bump protrudes from the through hole.

BRIEF DESCRIPTION OF THE DRAWINGS

FIG. 16 shows the cross sectional view of the final fan-out antenna packaging structure made in the above steps.

DESCRIPTIONS OF REFERENCE NUMERALS

Figure 1:
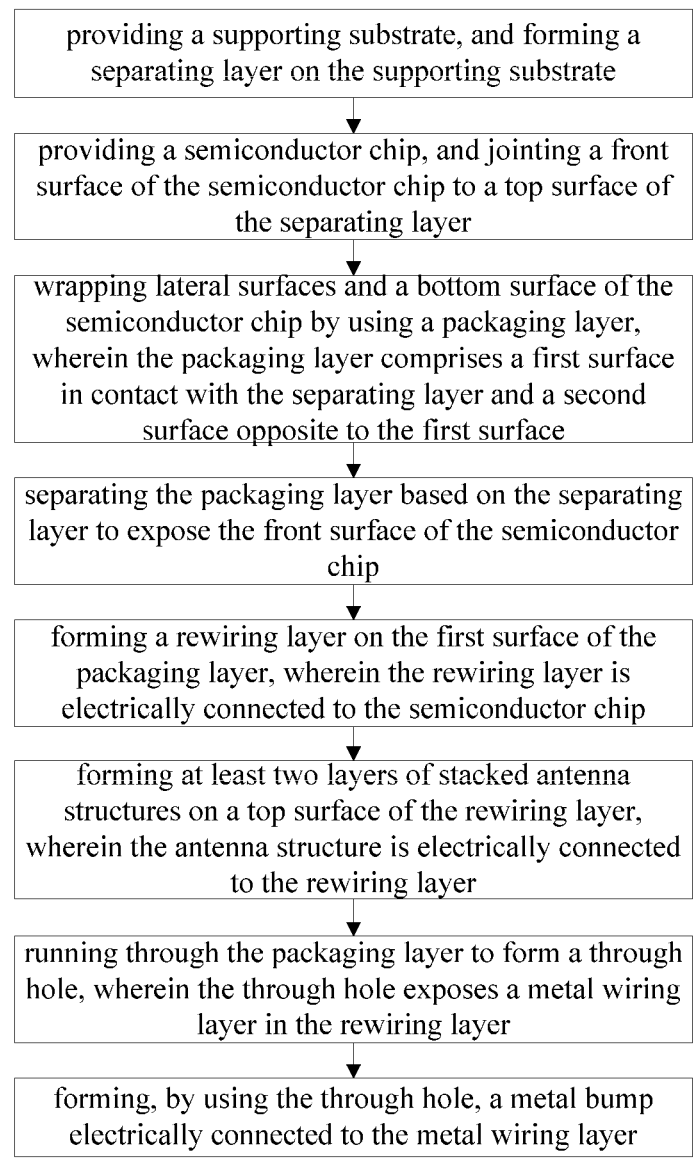
FIG. 1 is a flowchart disclosing a fan-out antenna packaging method in the present disclosure.

101 Supporting substrate
102 Separating layer
103 Semiconductor chip
104 Packaging layer
105 Rewiring layer
115 Dielectric layer
125 Metal wiring layer
106 First antenna structure
116 First antenna metal connecting block
126 First antenna metal connecting column
136 First antenna packaging layer
146 First antenna metal layer
107 Second antenna structure
117 Second antenna metal connecting block
127 Second antenna metal connecting column
137 Second antenna packaging layer
147 Second antenna metal layer
108 Through hole
109 Metal bump

DETAILED DESCRIPTION OF THE PREFERRED EMBODIMENTS

Implementations of the present disclosure are illustrated below through specific embodiments. Those skilled in the art can easily understand other advantages and efficacies of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complicated.

Embodiment 1

As shown in FIGS. 1-15, this embodiment provides a fan-out antenna packaging method, including the following steps:

providing a supporting substrate, and forming a separating layer on the supporting substrate;

providing a semiconductor chip, and jointing a front surface of the semiconductor chip to a top surface of the separating layer;

wrapping lateral surfaces and a bottom surface of the semiconductor chip by using a packaging layer, wherein the packaging layer comprises a first surface in contact with the separating layer and a second surface opposite to the first surface;

separating the packaging layer based on the separating layer to expose the front surface of the semiconductor chip;

forming a rewiring layer on the first surface of the packaging layer, wherein the rewiring layer is electrically connected to the semiconductor chip;

forming at least two layers of stacked antenna structures on a top surface of the rewiring layer, wherein the antenna structures are electrically connected to the rewiring layer;

running through the packaging layer to form a through hole, wherein the through hole exposes a metal wiring layer in the rewiring layer; and forming, by using the through hole, a metal bump electrically connected to the metal wiring layer.

The fan-out antenna packaging structure has a number of stacked layers with high conformity. Performance of the fan-out antenna packaging structure is improved by using the antenna structures on each side of the rewiring layer and the semiconductor chip. The fan-out antenna packaging method according to this embodiment can reduce production costs.

FIG. 2 to FIG. 16 illustrate cross sectional views after each of the steps in the fan-out antenna packaging process according to this embodiment.

Figure 2:
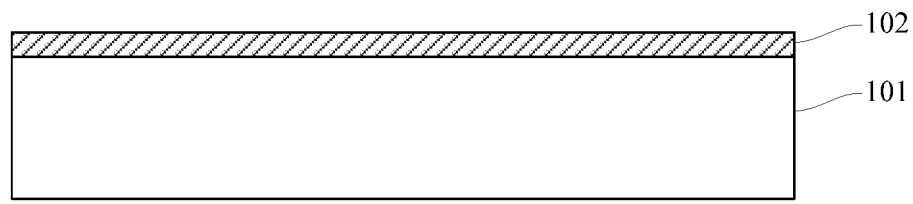
FIGS. 2-16 are cross sectional views after each of the steps in the fan-out antenna packaging process according to the present disclosure.

As shown in FIG. 2, a supporting substrate 101 is provided first, then a separating layer 102 is formed on the supporting substrate 101.

In this embodiment, the separating layer 102 comprises an adhesive tape whose viscosity decreases upon heating or illumination, so as to facilitate operations in a subsequent process and reduce production costs.

Specifically, the separating layer 102 may comprise a foaming agent. The foaming agent may comprise sodium carbonate, sodium bicarbonate, an azo compound, a sulfonyl-hydrazide compound, or a Nitroso compound, but is not limited to the examples listed herein. During heating, air bubbles can be generated in the separating layer 102, so that the separating layer 102 is expanded and the bonding strength of the separating layer 102 is reduced, thereby facilitating operations in a subsequent process. After the separating layer 102 is heated, the volume of the separating layer 102 can be expanded by 1% to 15%, for example, 10%. The separating layer 102 may also comprise an adhesive tape whose viscosity decreases upon illumination, for example, a UV film whose viscosity decreases upon ultraviolet illumination. The UV film can be solidified when illuminated by UV light, thereby shrinking the size of the separating layer 102 and reducing the bonding strength of the separating layer 102. The volume of the UV film can shrink by 5% to 10%, for example, 8%. The supporting substrate 101 may comprise one of a glass substrate, a metal substrate, a semiconductor substrate, a polymer substrate and a ceramic substrate, which is not limited herein.

Figure 3:
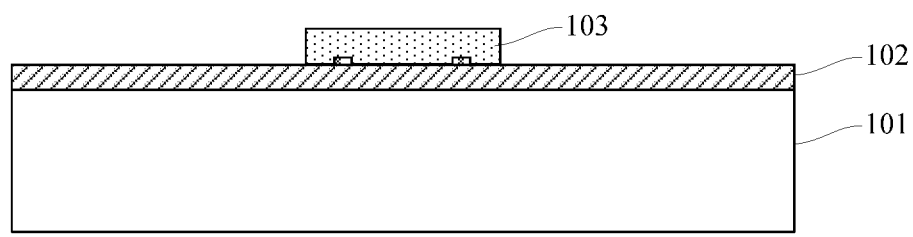

As shown in FIG. 3, a semiconductor chip 103 is provided, and a front surface of the semiconductor chip 103 is jointed to a top surface of the separating layer 102.

Specifically, the separating layer 102 is preferably an adhesive tape with viscosity on both sides, and the bonding strength between the separating layer 102 and the supporting substrate 101 is greater than the bonding strength between the separating layer 102 and the semiconductor chip 103, so that the semiconductor chip 103 can be directly adhered to the top surface of the separating layer 102. Moreover, this facilitates a subsequent separation process, reduces process complexity, and cost.

Figure 4:
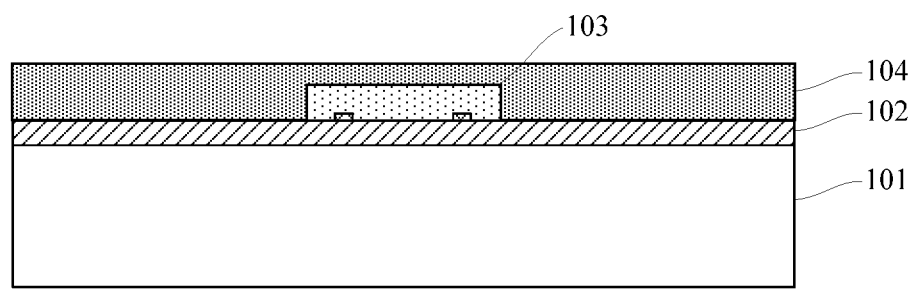

As shown in FIG. 4, lateral surfaces and a bottom surface of the semiconductor chip 103 are wrapped by using a packaging layer 104 that comprises a first surface in contact with the separating layer 102 and a second surface opposite to the first surface.

Specifically, the material of the packaging layer 104 may comprise one of epoxy resin, polyimide, and silica gel. In this embodiment, the packaging layer 104 is preferably a epoxy molding layer. The thickness of the packaging layer 104 can be selected according to specific requirements. For example, the thickness is preferable in a range from 100 μm to 1000 μm, which is not limited herein.

Figure 5:
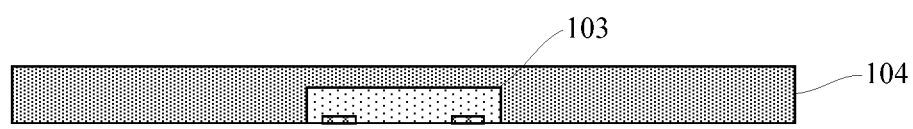
Figure 6:
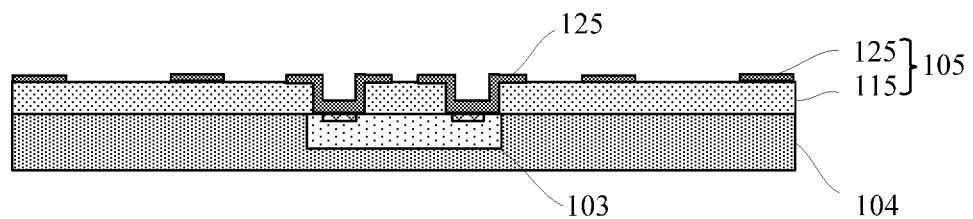
Figure 7:
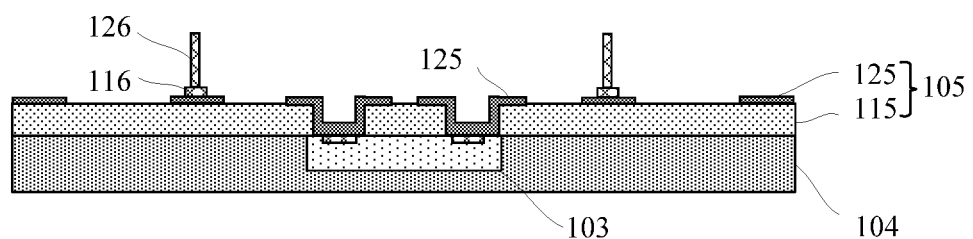
Figure 8:
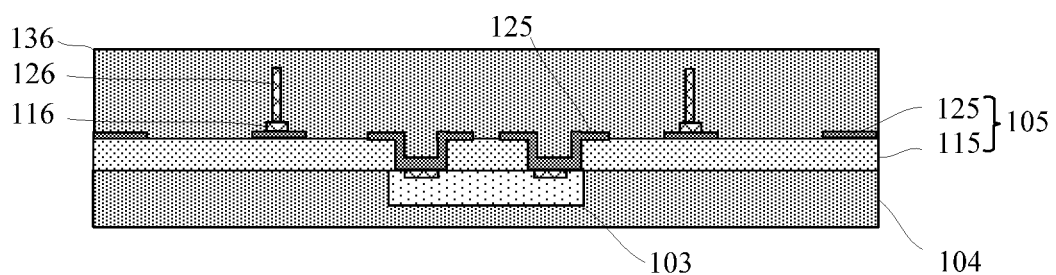
Figure 9:
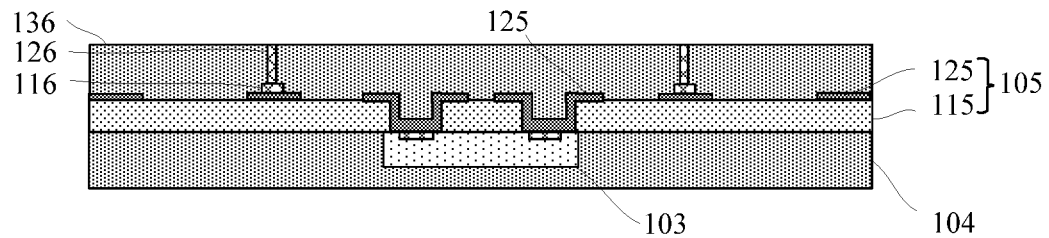
Figure 10:
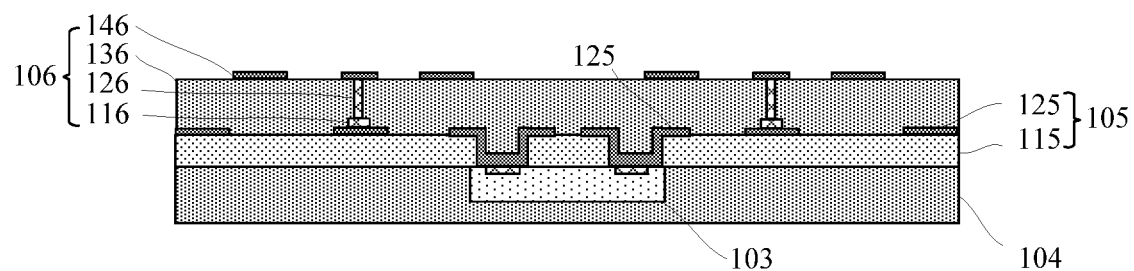
Figure 11:
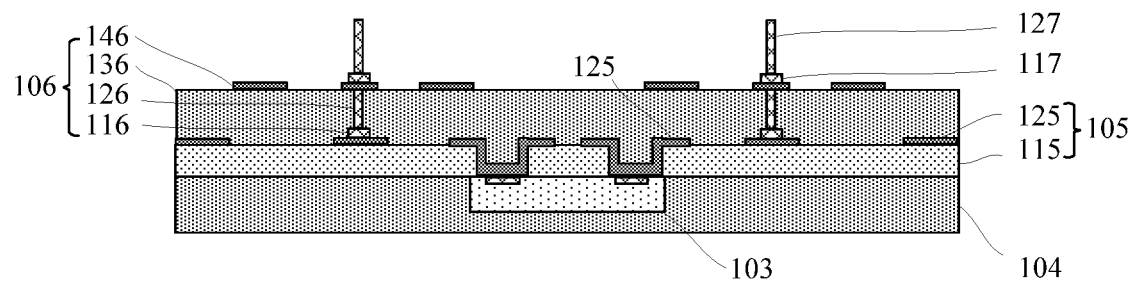
Figure 12:
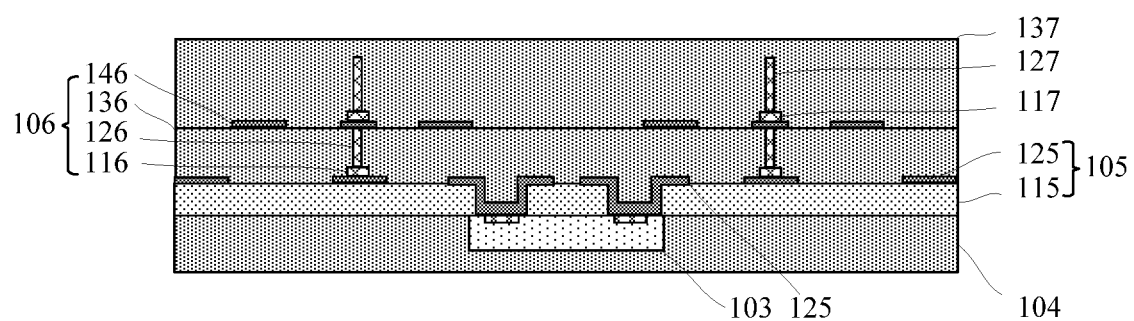
Figure 13:
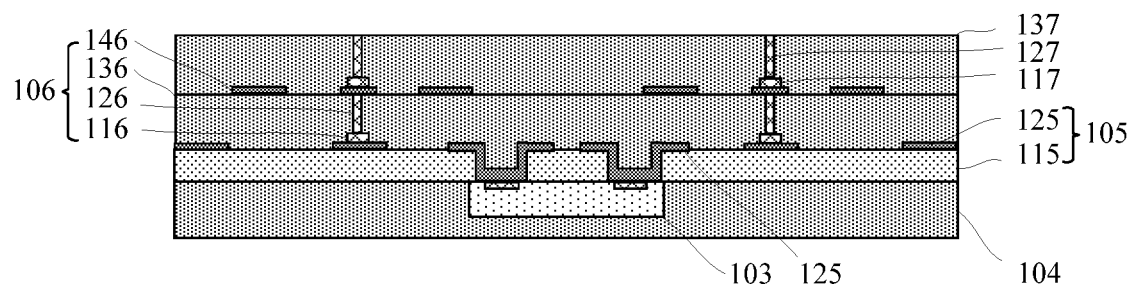
Figure 14:
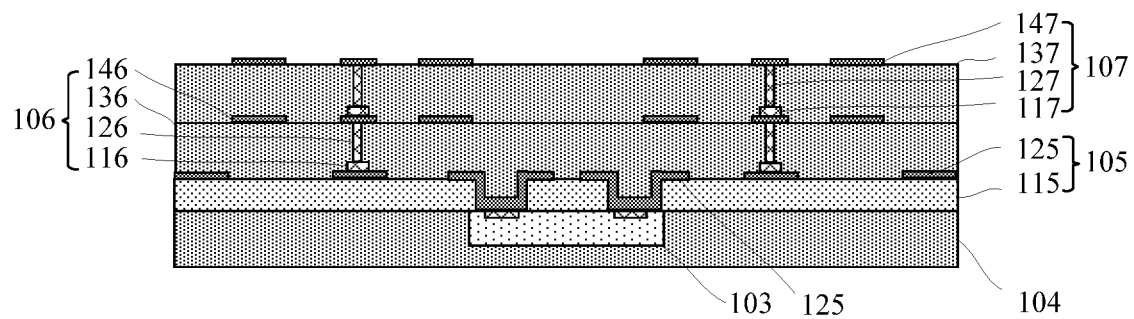

As shown in FIG. 5, the packaging layer 104 is separated based on the separating layer 102 to expose the front surface of the semiconductor chip 103. Then, as shown in FIG. 6, a rewiring layer 105 is formed on the first surface of the packaging layer 104, and the rewiring layer 105 is electrically connected to the front surface of the semiconductor chip 103.

Specifically, the rewiring layer 105 comprises a dielectric layer 115 and a metal wiring layer 125. Fabrication of the rewiring layer 105 comprises the following steps: forming the dielectric layer 115 on the first surface of the packaging layer 104 by using a physical vapor deposition process or a chemical vapor deposition process, then etching the dielectric layer 115 to form the patterned dielectric layer 115; after that, forming the metal wiring layer 125 on the surface of the patterned dielectric layer 115 by using a physical vapor deposition process, a chemical vapor deposition process, an evaporation process, a sputtering process, an electroplating process or a chemical plating process, and etching the metal wiring layer 125 to form the patterned metal wiring layer 125. The material of the dielectric layer 115 comprises one or a combination of epoxy resin, silica gel, Polyimide (PI), Polybenzoxazole (PBO), Benzocyclobutene (BCB), silicon oxide, phosphorosilicate glass, and fluorine-containing glass, and is preferably a common used epoxy resin material, so as to achieve desirable bonding performance with the packaging layer 104 and reduce a warpage level of the product. The material of the metal wiring layer 125 comprises one or a combination of copper, aluminum, nickel, gold, silver, and titanium. The number and a distribution of the metal wiring layers 125 in the rewiring layer 105 can be selected according to specific requirements, and are not limited herein.

As shown in FIG. 7 to FIG. 14, at least two layers of stacked antenna structures are formed on the top surface of the rewiring layer 105, wherein the antenna structures are electrically connected to the metal wiring layer 125 in the rewiring layer 105.

In this embodiment, the top surface of the rewiring layer 105 comprises a number (N) of the stacked antenna structures, wherein $N \geq 2$, so as to further improve the integration level and conformity of the fan-out antenna packaging structure.

Specifically, in this embodiment, the number N is 2, that is, the top surface of the rewiring layer 105 comprises two stacked antenna structures, which are a first antenna structure 106 and a second antenna structure 107. In another embodiment, the top surface of the rewiring layer 105 may also comprise more than three stacked antenna structures, for example, four or five stacks of antenna structures.

In this embodiment, the antenna structure comprises an antenna metal connecting column, an antenna packaging layer and an antenna metal layer.

Specifically, FIG. 7 to FIG. 10 illustrate cross sectional views after steps for forming the first antenna structure 106. The first antenna structure 106 comprises a first antenna metal connecting column 126, a first antenna packaging layer 136 and a first antenna metal layer 146. The first antenna metal connecting column 126 is electrically connected to the metal wiring layer 125 in the rewiring layer 105. The first antenna packaging layer 136 covers the first antenna metal connecting column 126 and exposes a top surface of the first antenna metal connecting column 126. The first antenna metal layer 146 is located on a top surface of the first antenna packaging layer 136 and is electrically connected to the first antenna metal connecting column 126, thereby forming the first antenna structure 106.

In a further embodiment of this embodiment, a method for forming the first antenna metal connecting column 126 comprises a bonding process, for example, a hot-pressing bonding process, an ultrasonic bonding process, or a hot-pressing ultrasonic bonding process. The material of the first antenna metal connecting column 126 comprises one or a combination of Au, Ag, Cu, and Al.

In this embodiment, the first antenna packaging layer 136 comprises an epoxy molding layer, so as to achieve desirable bonding performance with the rewiring layer 105 and further reduce the warpage level of the product. A method for forming the first antenna packaging layer 136 comprises compression molding, transfer molding, hydro-forming, vacuum lamination, or spin coating. The material of the first antenna packaging layer 136 may further comprise polyimide or silica gel, which can be selected according to specific requirements. After the first antenna packaging layer 136 is formed, the top surface of the first antenna packaging layer 136 may be grinded or polished, so that the first antenna packaging layer 136 is flat and product quality is improved.

In this embodiment, a method for forming the first antenna metal layer 146 comprises one of a physical vapor deposition process, a chemical vapor deposition process, an evaporation process, a sputtering process, an electroplating process and a chemical plating process. After the first antenna metal layer 146 is formed on the top surface of the first antenna packaging layer 136, the patterned first antenna metal layer 146 can be formed by using an etching process.

FIG. 11 to FIG. 14 illustrate cross sectional views after steps for forming the second antenna structure 107. The second antenna structure 107 comprises a second antenna metal connecting column 127, a second antenna packaging layer 137 and a second antenna metal layer 147. The second antenna metal connecting column 127 is electrically connected to the first antenna metal layer 146 in the first antenna structure 106. The second antenna packaging layer 137 covers the second antenna metal connecting column 127 and exposes a top surface of the second antenna metal connecting column 127. The second antenna metal layer 147 is located on a top surface of the second antenna packaging layer 137 and is electrically connected to the second antenna metal connecting column 127, thereby forming the second antenna structure 107. Methods and materials for forming the second antenna metal connecting column 127 and the second antenna metal layer 147 are the same as those of the first antenna structure 106, and details are not described herein again.

In a further embodiment of this embodiment, the second antenna packaging layer 137 comprises an epoxy molding layer, so as to achieve desirable bonding performance with the first antenna packaging layer 136 and further reduce the warpage level of the product. A method for forming the second antenna packaging layer 137 comprises one of compression molding, transfer molding, hydro-forming, vacuum lamination, and spin coating. The material of the second antenna packaging layer 137 may further comprise polyimide or silica gel, which can be selected according to specific requirements. After the second antenna packaging layer 137 is formed, the top surface of the second antenna packaging layer 137 can be grinded or polished, so that the provided second antenna packaging layer 137 is flat and product quality is improved.

In this embodiment, the antenna structure has a thickness ranging from 50 μm to 1000 μm, for example, a thickness of 100 μm or 500 μm. The thickness can be selected according to specific requirements, and is not limited herein.

In this embodiment, the formed fan-out antenna packaging structure has a warpage peak ranging from 0.1 mm to 3.0 mm.

Specifically, because the packaging layer 104, the dielectric layer 115, the first antenna packaging layer 136 and the second antenna packaging layer 137 all use the same epoxy resin material therefore bending in the same direction, the total warpage level of the fan-out antenna packaging structure can be reduced. The warpage peak of the fan-out antenna packaging structure ranges from 0.1 mm to 3.0 mm.

In this embodiment, the antenna metal connecting column may further comprise an antenna metal connecting block having a cross section larger than that of the antenna metal connecting column, for example, a first antenna metal connecting block 116 located between the first antenna metal connecting column 126 and the metal wiring layer 125, and a second antenna metal connecting block 117 located between the second antenna metal connecting column 127 and the first antenna metal layer 146, thereby increasing a contact area and improving electrical stability.

Figure 15:
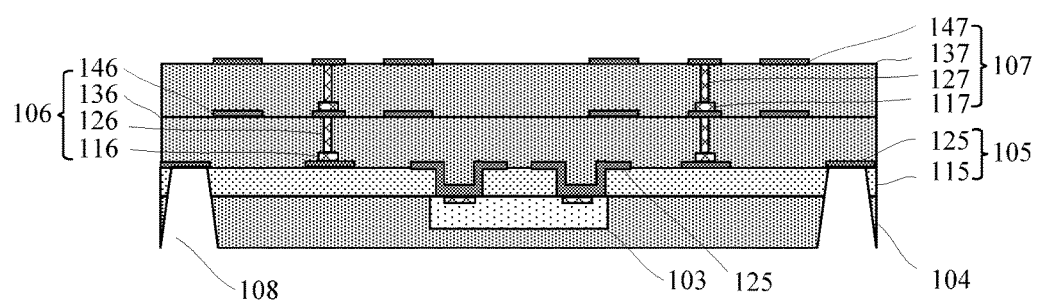

Next, as shown in FIG. 15, a through hole 108 through the packaging layer 104 is formed. The through hole 108 exposes the metal wiring layer 125 in the rewiring layer 105. The specific shape and size of the through hole 108 are not limited herein.

In a further embodiment of this embodiment, a method for forming the through hole 108 may comprise one of or a combination of laser drilling and dry etching. In this embodiment, the method is preferably laser drilling which is convenient and cheap, so as to further reduce the production costs.

Figure 16:
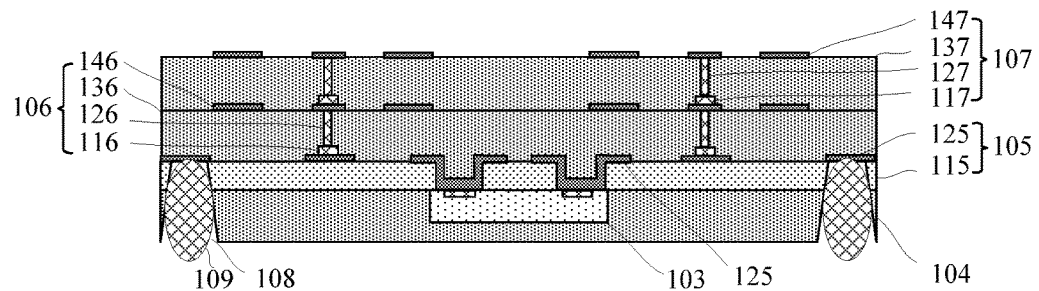

Finally, as shown in FIG. 16, a metal bump 109 electrically connected to the metal wiring layer 125 is formed by using the through hole 108. The metal bump 109 comprises one of a copper bump, a nickel bump, a tin bump and a silver bump, which is not limited herein. The metal bump 109 preferably protrudes from the through hole 108, so as to facilitate subsequent circuit connection and reduce process complexity.

Embodiment 2

FIG. 16 illustrates a cross sectional view of a fan-out antenna packaging structure in the present disclosure. The packaging structure includes:

a rewiring layer 105, the rewiring layer 105 comprising a first surface and a second surface opposite to the first surface;

at least two layers of stacked antenna structures, wherein the antenna structure is located on the second surface of the rewiring layer 105 and electrically connected to a metal wiring layer 125 in the rewiring layer 105;

a semiconductor chip 103 located on the first surface of the rewiring layer 105, wherein a front surface of the semiconductor chip 103 is electrically connected to the rewiring layer 105;

a packaging layer 104, wrapping lateral surfaces and a bottom surface of the semiconductor chip 103, wherein the packaging layer 104 comprises a through hole 108 that exposes the metal wiring layer 125; and a metal bump 109, electrically connected to the metal wiring layer 125 through the through hole 108.

In this embodiment, a fan-out antenna packaging structure has a number of stacked antenna structures in high conformity. Performance of the fan-out antenna packaging structure is improved by using the antenna structures on two sides of the rewiring layer and the semiconductor chip.

Specifically, the material of the packaging layer 104 may comprise one of epoxy resin, polyimide, and silica gel. In this embodiment, a epoxy molding layer is preferred. The thickness of the packaging layer 104 can be selected according to specific requirements. For example, the thickness may range from 100 μm to 1000 μm, and is not limited herein. The rewiring layer 105 comprises a dielectric layer 115 and a metal wiring layer 125. The material of the dielectric layer 115 comprises one or a combination of epoxy resin, silica gel, PI, PBO, BCB, silicon oxide, phosphorosilicate glass, and fluorine-containing glass. In this embodiment, a epoxy resin material is preferred, so as to achieve desirable bonding performance with the packaging layer 104 and reduce a warpage degree of the product. The material of the metal wiring layer 125 comprises one or a combination of copper, aluminum, nickel, gold, silver, and titanium. The number and distribution of the metal wiring layers 125 in the rewiring layer 105 can be selected according to specific requirements, and are not limited herein.

In this embodiment, a top surface of the rewiring layer 105 may have a number (N) of stacked antenna structures, where N≥2, so as to further improve the integration level and conformity of the fan-out antenna packaging structure.

Specifically, in this embodiment, N is 2, that is, the top surface of the rewiring layer 105 includes two stacked antenna structures, has a first antenna structure 106 and a second antenna structure 107. In another embodiment, the top surface of the rewiring layer 105 may also include more than three stacked antenna structures, for example, four layers or five layers, which is not limited herein.

In this embodiment, the antenna structure comprises an antenna metal connecting column, an antenna packaging layer and an antenna metal layer.

Specifically, FIG. 7 to FIG. 10 illustrate cross sectional views after steps for forming the first antenna structure 106. The first antenna structure 106 comprises a first antenna metal connecting column 126, a first antenna packaging layer 136 and a first antenna metal layer 146. The first antenna metal connecting column 126 is electrically connected to the metal wiring layer 125 in the rewiring layer 105. The first antenna packaging layer 136 covers the first antenna metal connecting column 126 and exposes a top surface of the first antenna metal connecting column 126. The first antenna metal layer 146 is located on a top surface of the first antenna packaging layer 136 and is electrically connected to the first antenna metal connecting column 126, thereby forming the first antenna structure 106.

In this embodiment, the first antenna packaging layer 136 includes an epoxy molding layer, to achieve desirable bonding with the rewiring layer 105 and further reduce the warpage level of the product. The material of the first antenna packaging layer 136 may further comprise polyimide or silica gel, which can be selected according to specific requirements.

FIG. 11 to FIG. 14 illustrate cross sectional views after each of the steps in forming the second antenna structure 107. The second antenna structure 107 comprises a second antenna metal connecting column 127, a second antenna packaging layer 137 and a second antenna metal layer 147. The second antenna metal connecting column 127 is electrically connected to the first antenna metal layer 146 in the first antenna structure 106. The second antenna packaging layer 137 covers the second antenna metal connecting column 127 and exposes a top surface of the second antenna metal connecting column 127. The second antenna metal layer 147 is located on a top surface of the second antenna packaging layer 137 and is electrically connected to the second antenna metal connecting column 127, thereby forming the second antenna structure 107.

In this embodiment, the second antenna packaging layer 137 comprises an epoxy molding layer, to achieve desirable bonding with the first antenna packaging layer 136 and further reduce the warpage level of the product. The material of the second antenna packaging layer 137 may further include one of polyimide and silica gel, which can be selected according to specific requirements.

In a further embodiment of this embodiment, the antenna structure has a thickness ranging from 50 µm to 1000 µm, for example, 100 µm or 500 µm. The thickness can be selected according to specific requirements, and is not limited herein.

In this embodiment, the formed fan-out antenna packaging structure has a warpage level ranging from 0.1 mm to 3.0 mm.

Specifically, because the packaging layer 104, the dielectric layer 115, the first antenna packaging layer 136 and the second antenna packaging layer 137 all use the same epoxy resin material, the warpage level of the formed fan-out antenna packaging structure can be reduced. The warpage level of the fan-out antenna packaging structure ranges from 0.1 mm to 3.0 mm, for example, 0.5 mm, 1.0 mm, or 2.0 mm.

In this embodiment, the antenna metal connecting column may further comprise an antenna metal connecting block having a cross section larger than that of the antenna metal connecting column, for example, a first antenna metal connecting block 116 located between the first antenna metal connecting column 126 and the metal wiring layer 125 and a second antenna metal connecting block 117 located between the second antenna metal connecting column 127 and the first antenna metal layer 146, thereby increasing a contact area and improving electrical stability.

In a further embodiment of this embodiment, the metal bump 109 comprises one of a copper bump, a nickel bump, a tin bump and a silver bump, which is not limited herein. The metal bump 109 preferably protrudes from the through hole 108, so as to facilitate subsequent circuit connection and reduce the process complexity.

To sum up, the disclosed fan-out antenna packaging method can be used to reduce production costs and form a fan-out antenna packaging structure having a number of stacked antenna structures in conformity. Performance of the fan-out antenna packaging structure is improved by using the antenna structures on two sides of the rewiring layer and the semiconductor chip. Therefore, the present disclosure effectively overcomes various disadvantages in the prior art and hence has high industrial use value.

The above embodiments are only to illustrate the principle and efficacies of the present disclosure exemplarily, and are not to limit the present disclosure. Any person skilled in the art can make modifications or variations on the above embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

What is claimed is:

1. A fan-out antenna packaging structure, comprising:
   a rewiring layer, comprising a first surface and a second surface opposite to the first surface;
   a first antenna structure, located directly on the second surface of the rewiring layer and electrically connected to a metal wiring layer in the rewiring layer, wherein the first antenna structure comprises a first antenna metal connecting block, a first antenna metal connecting column, a first antenna packaging layer, and a first antenna metal layer, wherein the first antenna metal layer is aligned with the first antenna metal column which is aligned with the first antenna metal block;
   a second antenna structure disposed on the first antenna structure, wherein the second antenna structure comprises a second antenna metal connecting block, a second antenna metal connecting column, a second antenna packaging layer, and a second antenna metal layer, wherein the second antenna block overlays and in direct contact with the first antenna metal layer, wherein the second antenna metal layer is aligned with the second antenna metal column which is aligned with the second antenna metal block; a semiconductor chip located on the first surface of the rewiring layer, wherein a front surface of the semiconductor chip is electrically connected to the rewiring layer;

a packaging layer, surrounding side surfaces and a bottom surface of the semiconductor chip and comprising a through hole that exposes the metal wiring layer; and a metal bump, electrically connected to the metal wiring layer through the through hole.

2. The fan-out antenna packaging structure according to claim 1, wherein the second surface of the rewiring layer comprises a third antenna structure on a top surface of the second antenna structure comprising a third antenna metal connecting block, a third antenna metal connecting column, a third antenna packaging layer, and a third antenna metal layer, wherein the third antenna block overlays and in direct contact with the second antenna metal layer, wherein the third antenna metal layer is aligned with the third antenna metal column which is aligned with the third antenna metal block.

3. The fan-out antenna packaging structure according to claim 1, wherein the first, second and third fan-out antenna packaging structures each has an in-package warpage level ranging from 0.1 mm to 3.0 mm.

4. The fan-out antenna packaging structure according to claim 1, wherein the first, second and third antenna structure has a thickness ranging from 50 μm to 1000 μm.

5. The fan-out antenna packaging structure according to claim 1, wherein the first antenna packaging layer surrounds the first antenna metal connecting column and exposes a top surface of the first antenna metal connecting column, and the first antenna metal layer is located on a top surface of the first antenna packaging layer and is electrically connected to the first metal connecting column.

6. The fan-out antenna packaging structure according to claim 1, wherein the first, second and third antenna packaging layers each comprises an epoxy molding layer.

7. The fan-out antenna packaging structure according to claim 1, wherein the metal bump protrudes from the through hole.

* * * * *